(12) United States Patent
Hongoh

(10) Patent No.: US 10,935,241 B2
(45) Date of Patent: Mar. 2, 2021

(54) ADDITIVELY MANUFACTURED HOTSPOT PORTION OF A TURBINE ENGINE COMPONENT HAVING HEAT RESISTANT PROPERTIES AND METHOD OF MANUFACTURE

(71) Applicant: United Technologies Corporation, Hartford, CT (US)

(72) Inventor: Masamichi Hongoh, Manchester, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 1067 days.

(21) Appl. No.: 14/707,754

(22) Filed: May 8, 2015

(65) Prior Publication Data
US 2016/0370007 A1    Dec. 22, 2016

Related U.S. Application Data

(60) Provisional application No. 61/990,742, filed on May 9, 2014.

(51) Int. Cl.
*F23R 3/00* (2006.01)
*B23K 26/342* (2014.01)
(Continued)

(52) U.S. Cl.
CPC ............ *F23R 3/002* (2013.01); *B22F 3/1055* (2013.01); *B22F 5/009* (2013.01); *B22F 7/06* (2013.01);
(Continued)

(58) Field of Classification Search
CPC ............ F05D 2230/30; F05D 2230/31; F05D 2230/313; F05D 2230/314; F05D 2230/80;
(Continued)

(56) References Cited

U.S. PATENT DOCUMENTS 4,323,756 A    4/1982   Brown
5,320,487 A *  6/1994   Walker ................... C30B 11/00
                                                     415/173.3
(Continued)

OTHER PUBLICATIONS

Suman Das, "Research Overview", Direct Digital Manufacturing Laboratory, Leading Edge Additive Manfuacturing Across Diverse Material Classes and Length Scales, 2014.
(Continued)

*Primary Examiner* — Scott J Walthour
*Assistant Examiner* — William L Breazeal
(74) *Attorney, Agent, or Firm* — Getz Balich LLC

(57) ABSTRACT

A turbine engine component has a first portion and a hotspot portion with both portions being substantially covered with a thermal barrier coating (TBC). The hotspot portion may be additively manufactured to the first portion. Furthermore, the hotspot portion may have a single crystal microstructure to resist high temperatures and the first portion may not have such a microstructure and may further be cast. A method of forming the component includes the steps of casting the first portion and additively manufacturing the hotspot portion to the first portion, then covering the first and hotspot portion with the TBC.

14 Claims, 7 Drawing Sheets

(51) Int. Cl.
*B22F 5/00* (2006.01)
*B23K 26/082* (2014.01)
*B22F 3/105* (2006.01)
*B22F 7/06* (2006.01)
*C30B 13/24* (2006.01)
*C30B 29/52* (2006.01)
*B33Y 80/00* (2015.01)
*B23K 101/00* (2006.01)
*B23K 103/00* (2006.01)

(52) U.S. Cl.
CPC ......... *B23K 26/082* (2015.10); *B23K 26/342* (2015.10); *C30B 13/24* (2013.01); *C30B 29/52* (2013.01); *B22F 2007/068* (2013.01); *B22F 2999/00* (2013.01); *B23K 2101/001* (2018.08); *B23K 2103/50* (2018.08); *B33Y 80/00* (2014.12); *F23R 2900/00019* (2013.01); *Y02P 10/295* (2015.11); *Y02T 50/6765* (2018.05)

(58) Field of Classification Search
CPC ........ F05D 2230/90; F23R 2900/00018; F23R 2900/00019; F23R 2900/03043; F23R 2900/03044; F23R 2900/03045; F23R 3/045; F23R 3/002; F23R 3/06; B33Y 10/00; B33Y 70/00; B23K 26/342; B28C 63/00; B29C 64/153
See application file for complete search history.

(56) References Cited

U.S. PATENT DOCUMENTS

| | | | | |
|---|---|---|---|---|
| 5,865,030 A * | 2/1999 | Matsuhama | ............ | F02C 7/224 60/267 |
| 5,865,598 A * | 2/1999 | Twerdochlib | .......... | G01K 11/10 415/118 |
| 8,506,836 B2 | 8/2013 | Szuromi | | |
| 2007/0059550 A1 * | 3/2007 | Jones | ...................... | C22C 19/00 428/632 |
| 2011/0023495 A1 * | 2/2011 | Bronson | ................... | F23R 3/06 60/752 |
| 2011/0048024 A1 * | 3/2011 | Snyder | ..................... | F23R 3/06 60/754 |
| 2013/0000309 A1 * | 1/2013 | Dierberger | ............. | F23R 3/002 60/752 |
| 2013/0019603 A1 * | 1/2013 | Dierberger | ............. | F23R 3/002 60/772 |
| 2013/0142661 A1 * | 6/2013 | Hardy | ................... | C22C 19/056 416/241 R |
| 2013/0255269 A1 * | 10/2013 | McKenzie | ................ | F23R 3/50 60/772 |
| 2014/0163717 A1 * | 6/2014 | Das | ...................... | B22F 3/1055 700/119 |
| 2014/0248425 A1 * | 9/2014 | Patterson | ................. | C23C 4/02 427/142 |
| 2014/0314581 A1 | 10/2014 | McBrien | | |
| 2015/0033559 A1 | 2/2015 | Bruck | | |
| 2015/0037498 A1 | 5/2015 | Bruck | | |

OTHER PUBLICATIONS

P. Caron, "Recent Studies at Onera on Superalloys for Single Crystal Turbine Blades", High Temperature Materials, Aerospace Lab Journal, Issue 3, Nov. 2011.

Phil S. Burkholder, "CM 186 LC Alloy Single Crystal Turbine Vanes", Presented at the ASME Turbo Expo '98, Indianapolis, Indiana, Jun. 7-10, 1998.

Hao Lu, "Development of the Thin Shell Casting Technology for Downwards Directional Solidification", Giesserei Institut, Rwthaachen University, ISBN 978-3-944601-00-7, Apr. 29, 2013.

M. Gell, "The Development of Single Crystal Superalloy Turbine Blades", downloaded from <http://www.tms.org/superalloys/10.7449/1980/superalloys_1980_205_214.pdf>, pp. 205-214, 1980.

* cited by examiner

ADDITIVELY MANUFACTURED HOTSPOT PORTION OF A TURBINE ENGINE COMPONENT HAVING HEAT RESISTANT PROPERTIES AND METHOD OF MANUFACTURE

This application claims priority to U.S. Patent Appln. No. 61/990,742 filed May 9, 2014.

BACKGROUND

The present disclosure relates to a gas turbine engine and, more particularly, to an additively manufactured hotspot portion of a turbine engine component having heat resistant properties.

Gas turbine engines, such as those that power modern commercial and military aircraft, include a fan section to propel the aircraft, compressor section to pressurize a supply of air from the fan section, a combustor section to burn a hydrocarbon fuel in the presence of the pressurized air, and a turbine section to extract energy from the resultant combustion gases and generate thrust.

The combustor section may have an annular wall having inner and outer shells that support respective inner and outer heat shielding liners. The liners may be comprised of a plurality of floating heat shields or panels that together define an annular combustion chamber. An annular cooling plenum is defined between the respective shells and liners for supplying cooling air to an opposite hot side of the panels through a plurality of strategically placed cooling or effusion holes. The effusion holes are generally orientated to create a protective blanket or air film over the hot side of the panels, thereby protecting the panels from the hot combustion gases in the chamber.

Unfortunately, and even with the air film and use of thermal barrier coatings, hot spots are still known to exist at isolated locations on each panel. The hotspots create thermal mechanical stresses that lead to cracking and a shortened panel lifespan. Moreover, increasing the density of cooling holes near or at such hotspots can reduce engine efficiency and/or deprive cooling to other locations in the combustor section or in the engine in general.

SUMMARY

A turbine engine component according to one, non-limiting embodiment of the present disclosure includes a first portion, a hotspot portion additively manufactured to the first portion, and a TBC covering at least in-part the first and second portions.

Additionally to the foregoing embodiment, the component includes a compound face including an exposed TBC face and an exposed hotspot portion face.

In the alternative or additionally thereto, in the foregoing embodiment, the additively manufactured hot spot portion is a repair.

In the alternative or additionally thereto, in the foregoing embodiment, the first portion has a single crystal microstructure and the additively manufactured hot spot portion has a single crystal microstructure.

In the alternative or additionally thereto, in the foregoing embodiment, the hotspot portion has a single crystal microstructure and the first portion does not.

In the alternative or additionally thereto, in the foregoing embodiment, the hotspot portion is formed from a single crystal powder.

In the alternative or additionally thereto, in the foregoing embodiment, the component includes a compound face including an exposed TBC face and an exposed hotspot portion face.

In the alternative or additionally thereto, in the foregoing embodiment, the component includes an interface located between the first portion and the hot spot portion; and a seed located at the interface for propagating the single crystal microstructure of the hotspot portion.

In the alternative or additionally thereto, in the foregoing embodiment, the additively manufactured hot spot portion is a repair.

In the alternative or additionally thereto, in the foregoing embodiment, the first portion is a casting.

In the alternative or additionally thereto, in the foregoing embodiment, the turbine engine component is a combustor liner.

In the alternative or additionally thereto, in the foregoing embodiment, the compound face defines at least in-part a dilution hole.

In the alternative or additionally thereto, in the foregoing embodiment, the liner includes a plurality of panels and the compound edge defines at least in-part a perimeter of at least one panel.

A component according to a second, non-limiting, embodiment includes a base portion that does not have a single crystal microstructure; an adjacent portion formed to the base portion and having a single crystal microstructure for withstanding elevated, localized, temperatures; and wherein the adjacent portion is formed to the base portion through additive manufacturing using a single crystal microstructure powder.

A method of forming a component according to a third, non-limiting, embodiment includes the steps of casting a first portion; and additively manufacturing a second portion having a single crystal microstructure to the first portion.

Additionally to the foregoing embodiment, the method includes the step of coating the first and second portions with a TBD.

In the alternative or additionally thereto, in the foregoing embodiment, the method includes the step of providing a single crystal powder for the additive manufacturing of the second portion.

In the alternative or additionally thereto, in the foregoing embodiment, the first portion is made of a pre-cast polycrystalline material.

In the alternative or additionally thereto, in the foregoing embodiment, the additive manufacturing utilizes a scanning laser.

In the alternative or additionally thereto, in the foregoing embodiment, the additive manufacturing includes controlling a temperature gradient utilizing a temperature control assembly.

The foregoing features and elements may be combined in various combinations without exclusivity, unless expressly indicated otherwise. These features and elements as well as the operation thereof will become more apparent in-light of the following description and the accompanying drawings. It should be understood, however, the following description and figures are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

The present disclosure generally entails the formation of a component having a first portion that may be economically cast and made of a relatively inexpensive material and/or composition and a second portion additively manufactured to the first portion that may be made of a relatively more expensive material that has greater heat resistance than the first portion, such as a material having a single crystal microstructure. The Detailed Description thus first generally describes a turbine engine and the many components that may be applied to the present disclosure, and as one non-limiting example, a geared turbofan engine that may run hotter than earlier engines and thus may take particular advantage of the present disclosure. The component portions are then described as they may apply to any number of engine components, and finally the additive manufacturing system and how it may be applied to the component having the two portions.

Turbine Engine Example

Figure 1:
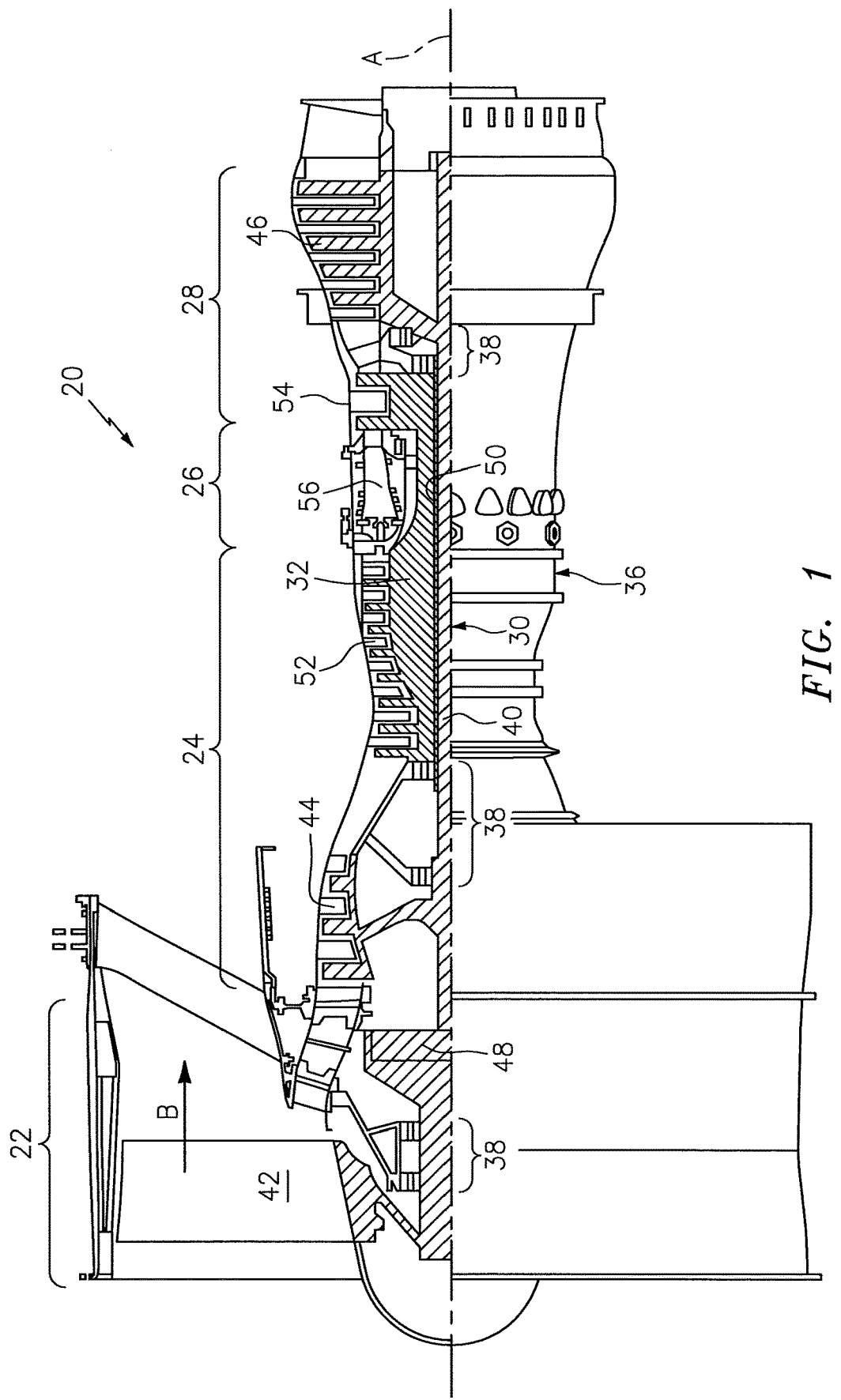
FIG. 1 is a schematic cross section of a gas turbine engine.

FIG. 1 schematically illustrates a gas turbine engine 20 disclosed as a two-spool turbo fan that generally incorporates a fan section 22, a compressor section 24, a combustor section 26 and a turbine section 28. The fan section 22 drives air along a bypass flowpath while the compressor section 24 drives air along a core flowpath for compression and communication into the combustor section 26 then expansion through the turbine section 28. Although depicted as a turbofan in the disclosed non-limiting embodiment, it should be understood that the concepts described herein are not limited to use with turbofans as the teachings may be applied to other types of turbine engine architecture such as turbojets, turboshafts, three-spool turbofans, land-based turbine engines, and others.

The engine 20 generally includes a low spool 30 and a high spool 32 mounted for rotation about an engine axis A via several bearing structures 38 and relative to a static engine case 36. The low spool 30 generally includes an inner shaft 40 that interconnects a fan 42 of the fan section 22, a low pressure compressor 44 ("LPC") of the compressor section 24 and a low pressure turbine 46 ("LPT") of the turbine section 28. The inner shaft 40 drives the fan 42 directly, or, through a geared architecture 48 to drive the fan 42 at a lower speed than the low spool 30. An exemplary reduction transmission may be an epicyclic transmission, namely a planetary or star gear system.

The high spool 32 includes an outer shaft 50 that interconnects a high pressure compressor 52 ("HPC") of the compressor section 24 and a high pressure turbine 54 ("HPT") of the turbine section 28. A combustor 56 of the combustor section 26 is arranged between the HPC 52 and the HPT 54. The inner shaft 40 and the outer shaft 50 are concentric and rotate about the engine axis A. Core airflow is compressed by the LPC 44 then the HPC 52, mixed with the fuel and burned in the combustor 56, then expanded over the HPT 54 and the LPT 46. The LPT 46 and HPT 54 rotationally drive the respective low spool 30 and high spool 32 in response to the expansion.

In one non-limiting example, the gas turbine engine 20 is a high-bypass geared aircraft engine. In a further example, the gas turbine engine 20 bypass ratio is greater than about six (6:1). The geared architecture 48 can include an epicyclic gear train, such as a planetary gear system or other gear system. The example epicyclic gear train has a gear reduction ratio of greater than about 2.3:1, and in another example is greater than about 2.5:1. The geared turbofan enables operation of the low spool 30 at higher speeds that can increase the operational efficiency of the LPC 44 and LPT 46 and render increased pressure in a fewer number of stages.

A pressure ratio associated with the LPT 46 is pressure measured prior to the inlet of the LPT 46 as related to the pressure at the outlet of the LPT 46 prior to an exhaust nozzle of the gas turbine engine 20. In one non-limiting example, the bypass ratio of the gas turbine engine 20 is greater than about ten (10:1); the fan diameter is significantly larger than the LPC 44; and the LPT 46 has a pressure ratio that is greater than about five (5:1). It should be understood; however, that the above parameters are only exemplary of one example of a geared architecture engine and that the present disclosure is applicable to other gas turbine engines including direct drive turbofans.

In one non-limiting example, a significant amount of thrust is provided by the bypass flow path B due to the high bypass ratio. The fan section 22 of the gas turbine engine 20 is designed for a particular flight condition—typically cruise at about 0.8 Mach and about 35,000 feet. This flight condition, with the gas turbine engine 20 at its best fuel consumption, is also known as Thrust Specific Fuel consumption (TSFC). TSFC is an industry standard parameter of fuel consumption per unit of thrust.

Fan Pressure Ratio is the pressure ratio across a blade of the fan section 22 without the use of a fan exit guide vane system. The low Fan Pressure Ratio according to one, non-limiting, example of the gas turbine engine 20 is less than 1.45:1. Low Corrected Fan Tip Speed is the actual fan tip speed divided by an industry standard temperature correction of $(T/518.7^{0.5})$, where "T" represents the ambient temperature in degrees Rankine. The Low Corrected Fan Tip Speed according to one non-limiting example of the gas turbine engine 20 is less than about 1150 fps (351 m/s).

Figure 2:
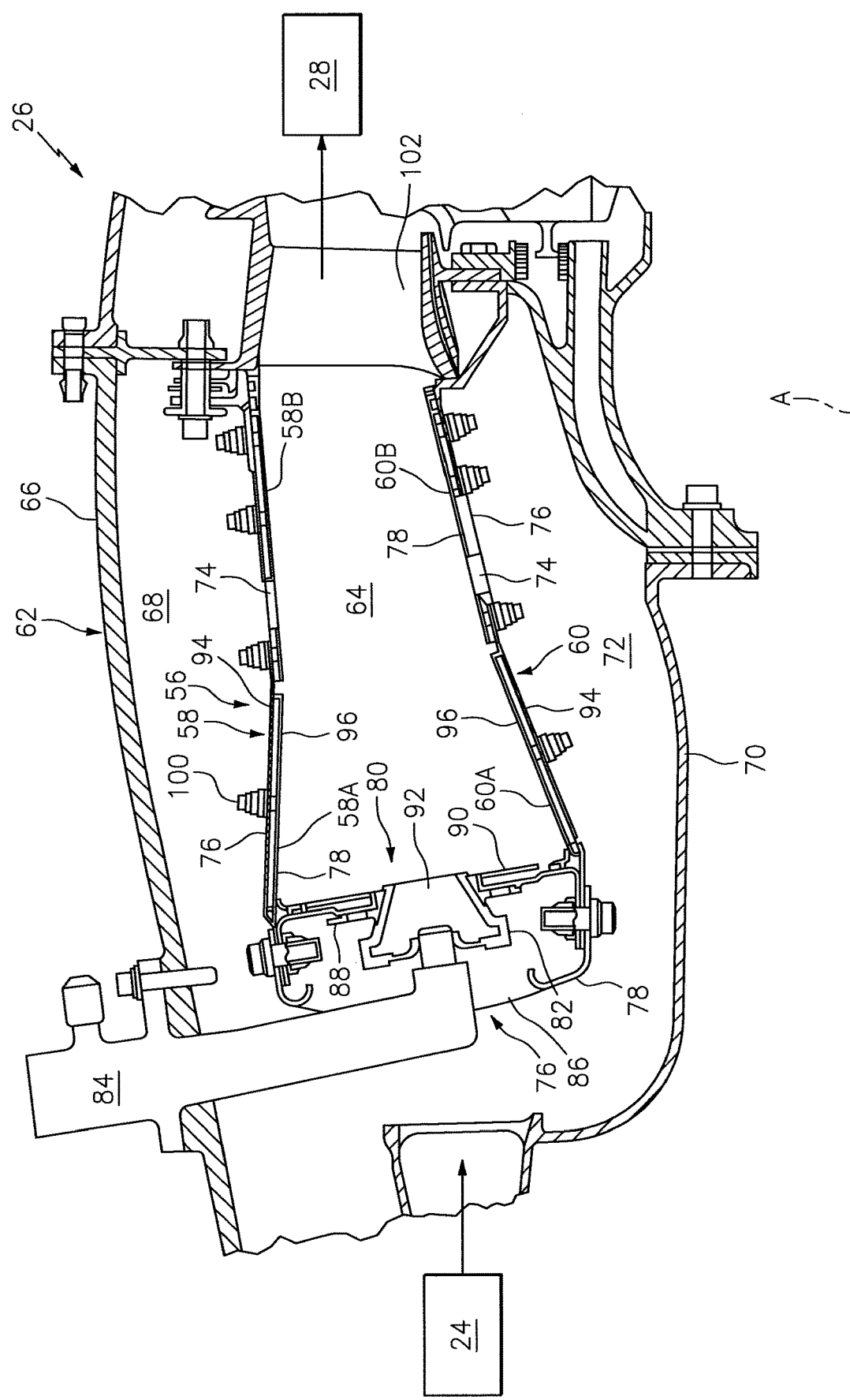
FIG. 2 is a cross section of a combustor section.

Referring to FIG. 2, the combustor section 26 generally includes an annular combustor 56 with an outer wall assembly 58, an inner wall assembly 60, and a diffuser case module 62 that surrounds wall assemblies 58, 60. The outer and inner wall assemblies 58, 60 are generally cylindrical and radially spaced apart such that an annular combustion chamber 64 is defined therebetween. The outer wall assembly 58 is spaced radially inward from an outer diffuser case 66 of the diffuser case module 62 to define an annular outer plenum 68. The inner wall assembly 60 is spaced radially outward from an inner diffuser case 70 of the diffuser case module 62 to define, in-part, an annular inner plenum 72. Although a particular combustor is illustrated, it should be understood that other combustor types with various combustor liner arrangements will also benefit. It is further understood that the disclosed cooling flow paths are but an illustrated embodiment and should not be so limited.

The combustion chamber 64 contains the combustion products that flow axially toward the turbine section 28. Each combustor wall assembly 58, 60 may be divided into a ring-shaped forward portion 58A, 60A and a ring-shaped aft or downstream portion 58B, 60B. At least one igniter (not shown) may project through a hole in the forward portion 58A of the outer wall assembly 58 for igniting a fuel and air mixture in the combustion chamber 64. A plurality of circumferentially spaced dilution holes 74 may communicate through the downstream portions 58B, 60B of the respective outer and inner wall assemblies 58, 60 for flowing dilution air (see arrow 75 in FIG. 4) from the respective plenums 68, 72 and into the combustion chamber 64. This dilution air improves combustion and dilutes or quenches the hot combustion gases (see arrow 77) within the combustion chamber 64 to provide a more even combustor exit temperature profile to protect the downstream turbine section 28.

Figure 6:
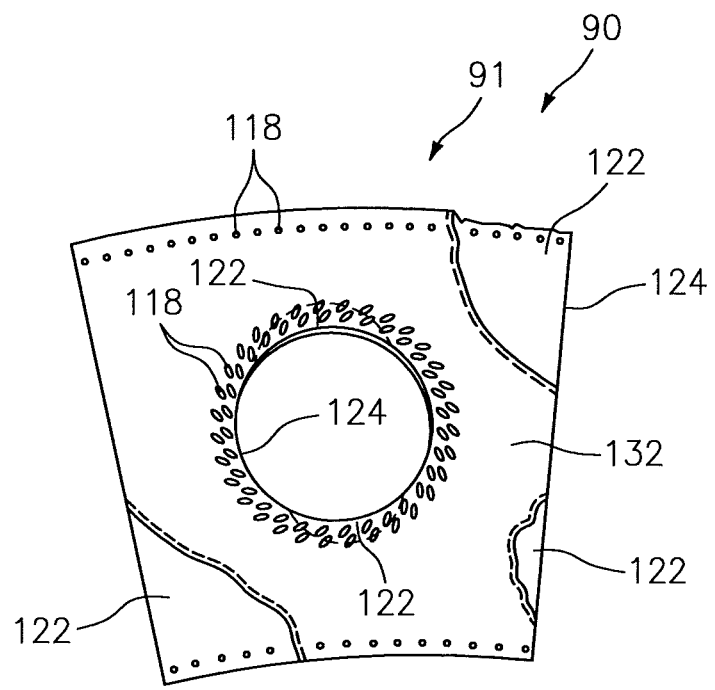
FIG. 6 is a plan view of a bulkhead liner panel.

The combustor 56 further includes a forward assembly 76 that receives compressed airflow from the compressor section 24 located immediately upstream. The forward assembly 76 generally includes an annular hood 78, a bulkhead assembly 80, and a plurality of swirlers 82 (one shown). Each of the swirlers 82 are circumferentially aligned with one of a plurality of fuel nozzles 84 (one shown) and a respective hood port 86 to project through the bulkhead assembly 80. The bulkhead assembly 80 includes a bulkhead support shell 88 secured to the forward portions 58A, 60A of the respective wall assemblies 58, 60 and an annular liner 90 secured to the bulkhead support shell 88 and coated with a thermal barrier coating (TBC). As best shown in FIG. 6, the liner 90 may include a plurality of panels 91 with each panel being secured to the bulkhead support shell 88 around each respective swirler 82 opening. The bulkhead support shell 88 is generally annular and the plurality of circumferentially distributed bulkhead liner panels 91 may be segmented, typically one to each fuel nozzle 84 and swirler 82.

The annular hood 78 extends radially between, and is secured to, the forward-most ends of the forward portion 58A, 60A of the respective wall assemblies 58, 60. Each one of the plurality of circumferentially distributed hood ports 86 receives a respective one of the plurality of fuel nozzles 84, and facilitates the direction of compressed air into the forward end of the combustion chamber 64 through a swirler opening 92. Each fuel nozzle 84 may be secured to the outer diffuser case 66 of the case module 62 and projects through one of the hood ports 86 into the respective swirler 82.

The forward assembly 76 introduces core combustion air into the forward section of the combustion chamber 64 while the remainder of compressor air enters the outer annular plenum 68 and the inner annular plenum 72. The plurality of fuel nozzles 84 and adjacent structure generate a blended fuel-air mixture that supports stable combustion in the combustion chamber 64.

Each wall assembly 58, 60 includes a support shell 94 that supports one or more thermally resistant heat shields or liners 96 that define the annular combustion chamber 64. The liners 96 may be formed of a plurality of arcuate, floating, panels 98 that are generally rectilinear and manufactured of, for example, a nickel based super alloy that may be coated with a ceramic or other temperature resistant material (i.e. thermal barrier coating), and are arranged to form a panel array mounted to the support shell 94. Each panel 98 of the liner 96 may be supported to the support shell 94 by at least one stanchion or threaded bolt 100 (see FIG. 5) projecting rigidly from the panel 98 and through the shell 94 and in such a way that limited thermal expansion and/or displacement between the shell and panel may occur.

Opposite the forward assembly 76, the support shells 94 of the wall assemblies 58, 60 are mounted adjacent to a first row of Nozzle Guide Vanes (NGVs) 102 in the HPT 54. The NGVs 102 are static engine components that direct core airflow combustion gases onto the turbine blades of the first turbine rotor in the turbine section 28 to facilitate the conversion of pressure energy into kinetic energy. The core airflow combustion gases are also accelerated by the NGVs 102 because of their convergent shape and are typically given a "spin" or a "swirl" in the direction of turbine rotor rotation. The turbine rotor blades absorb this energy to drive the turbine rotor at high speed.

Figure 3:
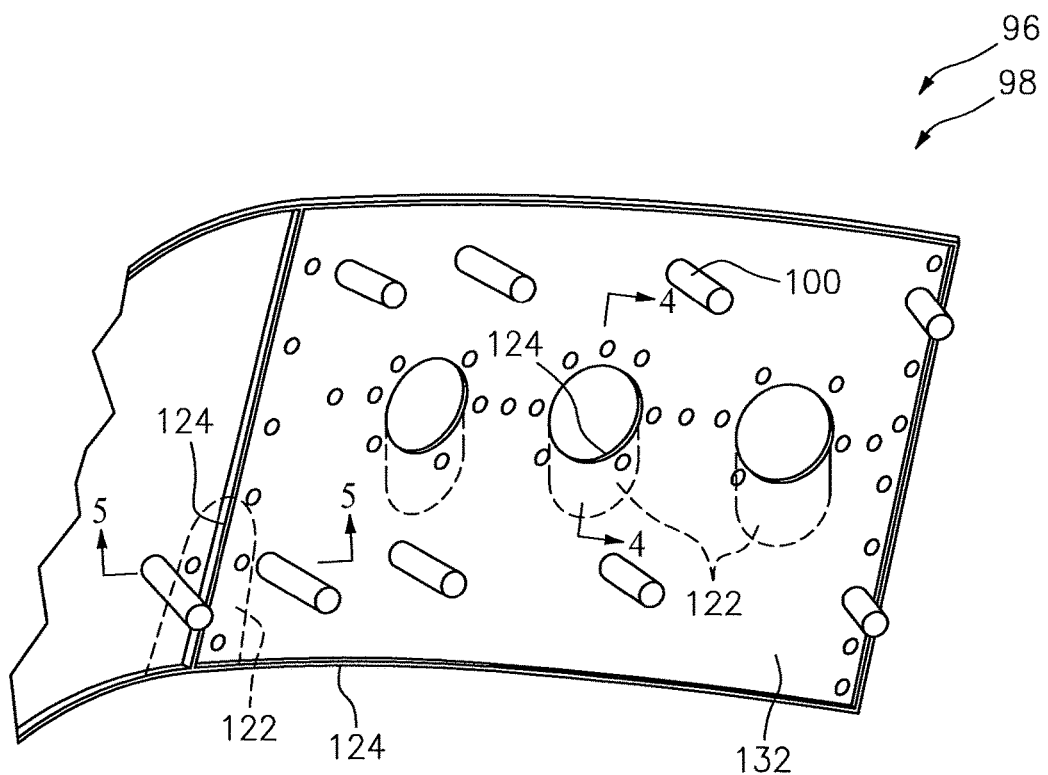
FIG. 3 is a plan view of a combustor wall assembly with a shell removed to show a liner panel, and according to one non-limiting embodiment of a component of the present disclosure.
Figure 4:
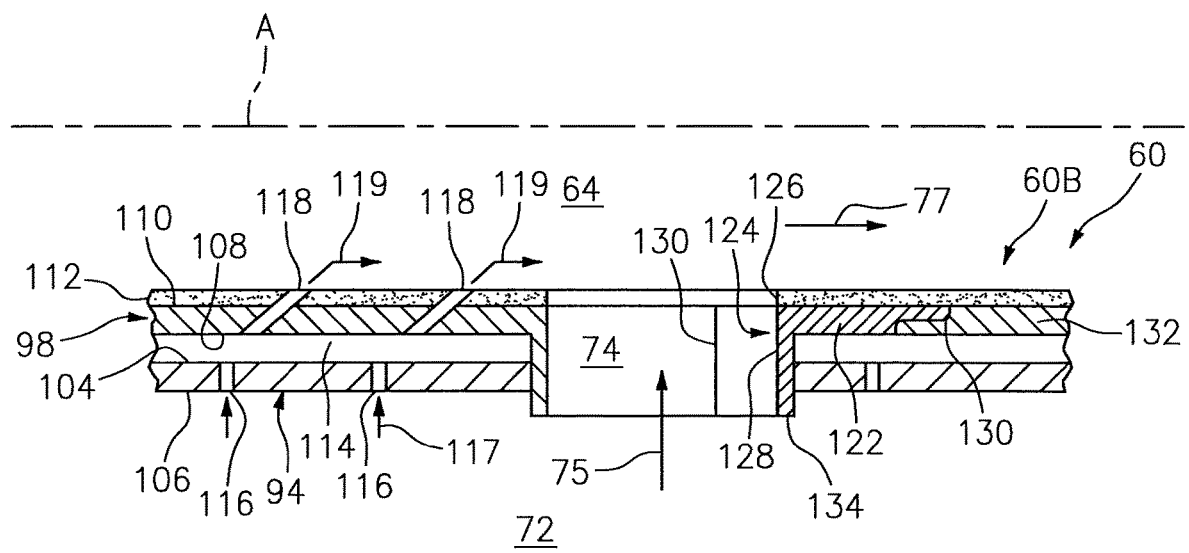
FIG. 4 is a cross section of the wall assembly of the combustor section taken along line 4-4 of FIG. 3.
Figure 5:
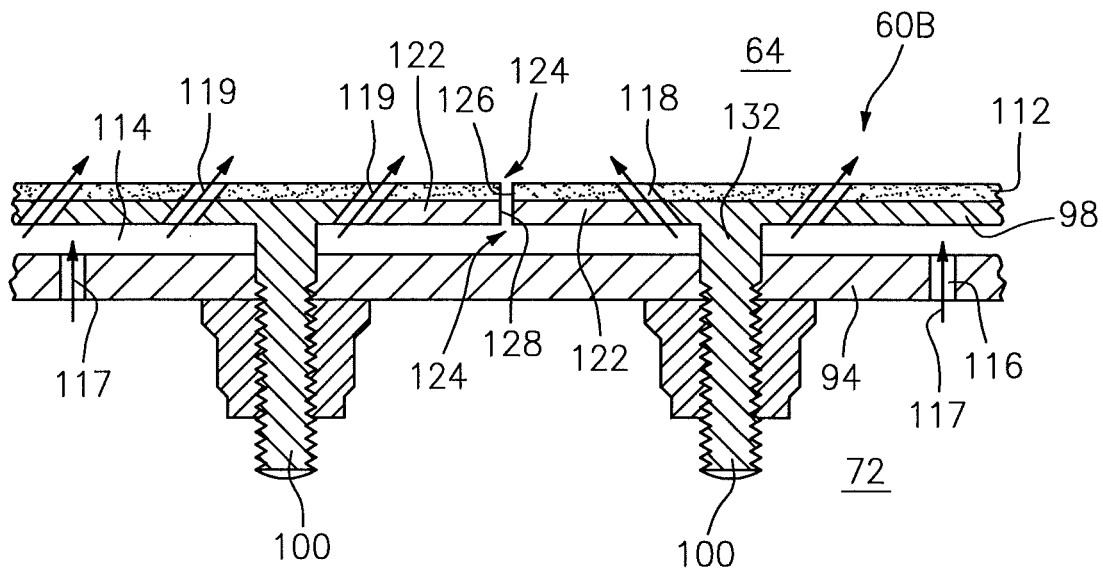
FIG. 5 is a cross section of the wall assembly taken along line 5-5 of FIG. 3.

Referring to FIGS. 3 through 5, the inner wall assembly 60 is illustrated; however, it should be known that the same teaching may be applied to the outer wall assembly 58. The support shell 94 has an inner surface 104 and an opposite outer surface 106 defining in-part the inner plenum 72. The panel 98 of the liner 96 has a cold surface 108 and an opposite hot surface 110 that may be generally coated with a thermal barrier coating (TBC) 112 and defining in-part a boundary of the annular combustion chamber 64. The inner surface 104 and the opposing cold surface 108 define an annular cooling cavity 114 generally located between the inner cooling plenum 72 and the combustion chamber 64.

A plurality of impingement holes 116 in the shell 94 communicate through the inner and outer surfaces 104, 106 and are in fluid communication between the cooling plenum 72 and the cooling cavity 114 for flowing cooling air (see arrow 117) into the cavity and impingement upon the cold surface 108 of the liner panel 98. A plurality of effusion or film cooling holes 118 in the panel 98 extend through the cold and hot surfaces 108, 110 and are in fluid communication between the cooling cavity 114 and the combustion chamber 64 for flowing cooling air (see arrow 119) into the combustion chamber 64 that may, in-turn, form a thin, cool, blanket or film of cooling air over the TBC 112 of the panel 98 for additional thermal protection of the liner 96 from hot combustion gasses.

Component Example

Even though the hot surfaces 110 of the liner panels 91, 98 may be coated with a TBC 112 and effusion or cooling holes 118 are distributed across the hot surfaces 110 to reduce any temperature gradients across the hot surface, unwanted hot spot portions 122 of the panels (best shown in FIGS. 3 and 6) and other turbine engine components, such as for example the NGVs 102, may still exist at selected locations, and thus reduce the useful life of the entire component. Such hotspot portions 122 may exist, for example, immediately downstream of the dilution holes 74, about or at the igniter hole (not shown), about or at the swirler hole 92, and generally at selected locations at an outer perimeter of the liners 90, 96 and or respective liner panels 91, 98.

Referring to FIGS. 3 through 6, many, if not all of these problematic hot spot portions 122 may carry a compound face 124 that may include an edge or face 126 of the TBC 112 and an exposed edge or face 128 of the underlying component (e.g. liners 90, 96). The compound face 124 may thus be, for example, an outer edge or perimeter carried by the liners 90, 96; may be an outer edge carried by the panels 91, 98; may be an inner edge carried by the liners 96 of the aft portions 58B, 60B of the respective wall assemblies 58, 60 and defining the dilution holes 74; may be an inner edge carried by the bulkhead liner 90 and defining each hole for receipt of the swirlers 82; may be an inner edge carried by the liner 96 at the forward portion 58A of the outer wall assembly 58 and defining a hole for receipt of an igniter; and various other applications. It is further contemplated and understood that where hot surface temperature gradients signify a need, hot spot portions 122 may not carry an exposed compound face and may be located mid span of any turbine engine component that may be part of the turbine engine hot gas flow path.

More traditional solutions to minimize or eliminate hot spots entailed dense groupings of effusion or cooling holes 118 at the hot spot locations. Unfortunately, such groupings, if they are even practical to apply, can still deprive cooling to other portions of the components and/or otherwise reduce engine operating efficiency. In accordance with the present disclosure and referring to FIGS. 4 and 5, a material-change, sintered, interface 130 may exist between the hot spot portion 122 and a base or remaining portion 132 of at least one of the components 90, 91, 96, 98, 102 (as an example). The base portion 132 may be made of a first material and the hot spot portion 122 may be made of a more thermally resistant material with the TBC 112 applied to both. As an example, the base portion 132 may be made of a relatively economical Ni-based super alloy and/or a pre-cast polycrystalline material; and, the hot spot portion 122 may also be made of a similar Ni-based super alloy but with a less-economical single crystal microstructure that may be additively manufactured to the base portion 132 at the sintered interface 130.

Utilizing an additive manufacturing process (e.g. laser scanning technique), to add the hot spot portion 122 to a newly cast base portion 132 may reduce manufacturing cost as compared to other solutions since casting is a relatively inexpensive process and the base portion may be made of less expensive materials (i.e. not necessarily single crystal microstructure). Moreover, the teachings of the present disclosure may be applied to component repairs where damaged hot spots can be removed from pre-existing components that may, or may not, be made of a single crystal microstructure and a new, hot spot portion 122 can be additively manufactured to the undamaged base portion 132.

The interface 130 may be of any variety of shapes that may be dictated by temperature gradients through the component and/or the strength of the bond at the interface. For example and as best shown in FIG. 4, a portion of the interface 130 may be between and substantially parallel to the cold and hot surfaces 108, 110 of the liner panel 98. Yet further, the hot spot portion 122 may include a segment of a grommet 134 of the liner panel 98 that defines the dilution hole 74. In such an example, the base face 128 may be carried by the grommet 134 and the interface 130 is at least in-part in the grommet 134.

Applicable Additive Manufacturing System and Process Example

Figure 7:
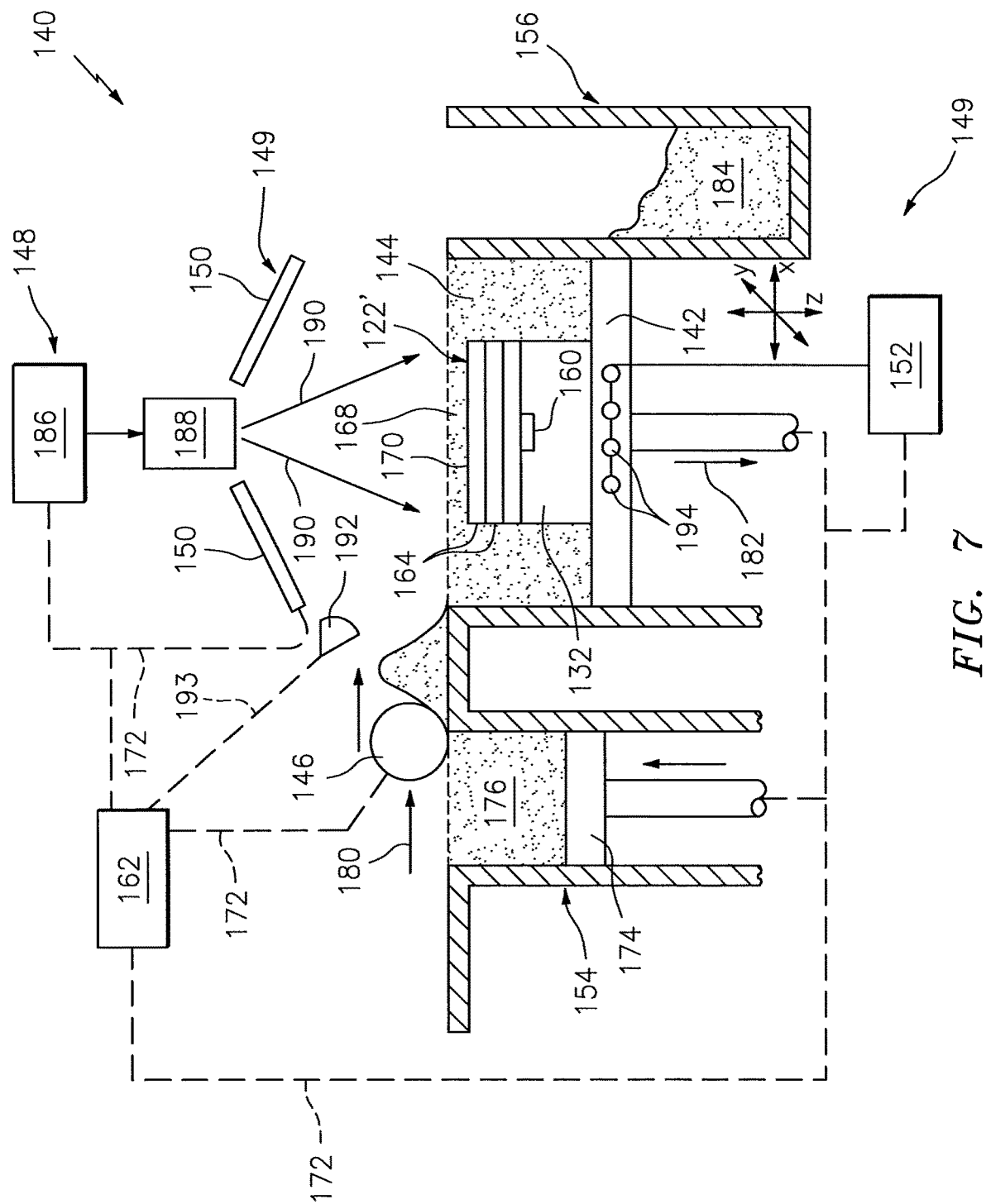
FIG. 7 is a schematic view of one, non-limiting, embodiment of an additive manufacturing system capable of manufacturing the component of the present disclosure.

Referring to FIG. 7 an additive manufacturing system 140 is schematically illustrated having a build table 142 for holding a powder bed 144, a particle spreader or wiper 146 for producing the powder bed 144, an energy gun 148 for selectively melting regions of a layer of the powder bed, a temperature control assembly 149 that may have multiple heating and cooling sources 150, 152 (with the sources controlling thermal gradients and solidification rates), a powder supply hopper 154 and a powder surplus hopper 156. The additive manufacturing system 140 is constructed and arranged to build the hotspot portion 122 upon the base portion 128 of any variety of components or workpieces in a layer-by-layer fashion utilizing an epitaxy process for forming directional, microstructure grains or, for example, single crystal growth in an alloy. The hot spot portion 122 may thus include a seed or substrate 160 with a desired directional microstructure grain, and/or a supply powder 176 of the powder bed 144 may be a powder having single crystal microstructure properties.

A controller 162 may have an integral computer aided design system for modeling the hotspot portion 122 into a plurality of slices 164 additively built atop one-another generally in a vertical or z-coordinate direction. Each solidified slice 164 corresponds to a layer 168 of the powder bed 144 prior to solidification. The layer 168 is placed on top of a build surface 170 of the previously solidified slice 164, or during initial operation, the base portion 128 generally at or over the interface 130, and the base portion 128 may be directly supported by the build table 142. The controller 162 generally operates the entire system through a series of electrical and/or digital signals 172 sent to the system 140 components. For instance, the controller 162 may send a signal 172 to a mechanical piston 174 of the supply hopper 154 to push a supply powder 176 upward for receipt by the spreader 146. The spreader 146 may be a wiper, roller, sprayer or other device that pushes (see arrow 180), sprays, or otherwise places the supply powder 176 over the build surface 170 of the hot portion 122 by a pre-determined thickness established by vertical, downward, movement (see arrow 182) of the build table 142. Any excess powder 184 may be pushed into the surplus hopper 156 by the spreader 146.

Once a substantially level powder layer 168 is established over the build surface 170, the controller 162 may send a signal to the energy gun 148 that energizes a laser or electron beam device 186 and controls a directional mechanism 188 of the gun 148. The directional mechanism 188 may include a focusing lens that focuses a beam (see arrows 190) emitted from device 186 which, in-turn may be deflected by an electromagnetic scanner or rotating mirror of the mechanism 188 so that the energy beam 190 selectively and controllably impinges upon selected regions of the top layer 168 of the powder bed 144. The beam 190 moves along the layer 168 melting region-by-region of the layer 168 at a controlled rate and power to, in-part, establish a predefined thermal gradient, generally melting each region into pools that then solidify at a controlled rate to promote the desired directional grain microstructure of the hot spot portion 122.

Figure 8:
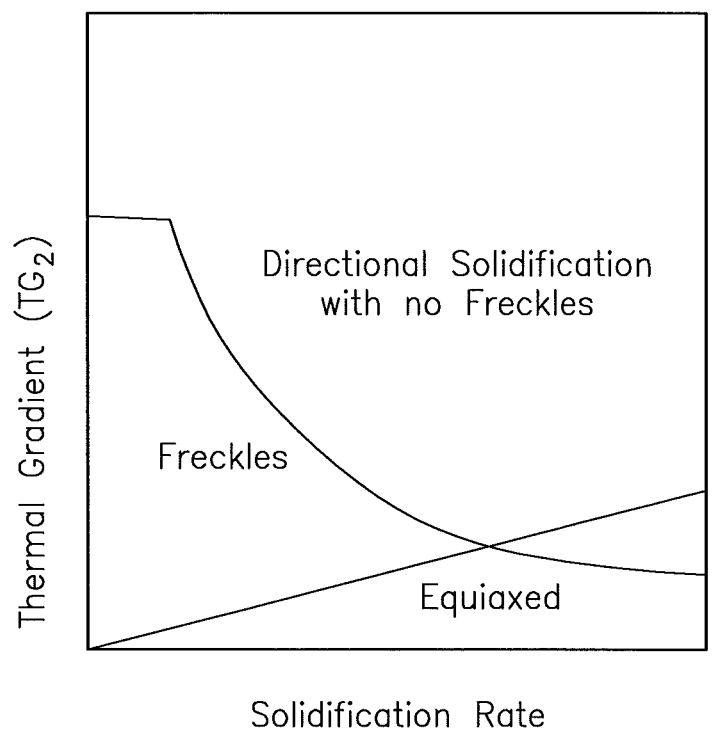
FIG. 8 is a chart of solidification rate verse thermal gradient.

Referring to FIG. 8, a graph of Solidification Rate verse Thermal Gradient is illustrated. The additive manufacturing system 140 operates to achieve directional solidification of the hot spot portion 122 through epitaxy, and avoid freckles whether created under equiaxed conditions or not. Therefore, at a pre-established and controlled solidification rate, the system 140 also operates to maintain and control a desirable thermal gradient toward the promotion of directional grains and as the melted powder solidifies and forms a slice 164 of the hotspot portion 122. More specifically, the controller 162 controls the elevated heating sources 150 that may be transiently operated (i.e. power output is adjustable) to establish the desired thermal gradient, and may be steady-state operated (i.e. power output is steady) to control the solidification rate. The controller 162 may control the heating and cooling sources 150, 152 utilizing a temperature sensor 192 of the temperature control assembly 149 that provides a feedback signal 193 indicative of the build surface temperature.

Figure 9:
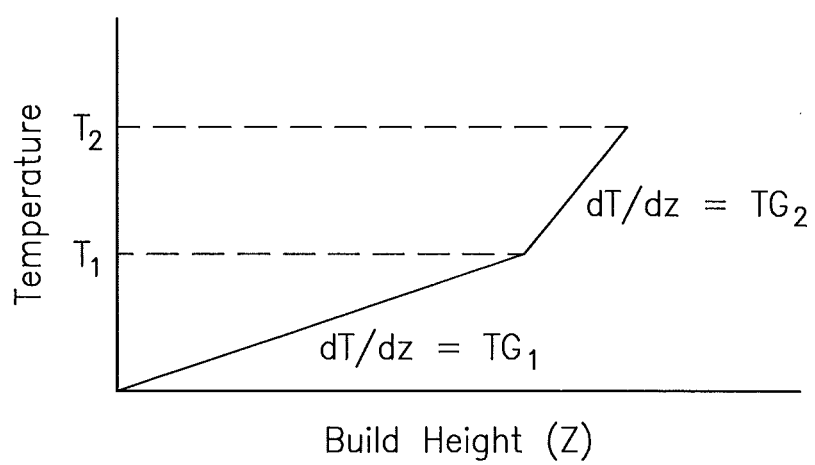
FIG. 9 is a chart of build height verse temperature.

Referring to FIG. 9, a directional solidification growth temperature gradient graph is illustrated. A temperature gradient $TG_1$ is the change in temperature over the height of the solidified workpiece layers that are already formed through the additive manufacturing process (i.e. distance from the initial build surface or interface 130 to the build surface 170 of the top slice 164). Temperature gradient $TG_1$ may be primarily dictated by the desire to maintain a build surface 170 predetermined temperature $T_1$ that is below a melting point temperature of the material, and may be slightly below melting temperature, and preferably about one hundred degrees Fahrenheit below the melting temperature for a material that is, for example, a nickel based superalloy. With the production of increasing height (i.e. additional solidified slices 164 beneath the build surface 170), the cooling source 152 may be the primary means to maintain temperature $T_1$, but may also operate in conjunction with the heating source 150.

At a given state or point in time, a temperature $T_2$ may be a melting temperature of the single crystal powder 176. A temperature gradient $TG_2$ is the difference in temperature $T_2$ and temperature $T_1$ divided by the height Z of the working powder layer. Since temperature $T_1$ may be held constant throughout the additive manufacturing of the next successive top slice 44, thermal gradient $TG_1$ will be constant for that slice and will be slightly lower for manufacturing of the next successive slice 164. Moreover, thermal gradient $TG_2$ will decrease over time and as the melt pool of the powder layer solidifies. That is, temperature $T_1$ is held constant and temperature $T_2$ will decrease at a controlled rate primarily through transient operation of the heating source 150. Referring further to FIG. 8, this change in temperature of temperature $T_2$ is directly related to the solidification rate. Therefore, with a given solidification rate, the range of the decreasing thermal gradient $TG_2$ during solidification should generally be found in the 'Directional Solidification with no Freckles region of FIG. 8.

The controller 162 operates to condition and maintain the build surface temperature $T_1$ slightly below melting and preferably about one hundred degrees Fahrenheit below melting for nickel based superalloys, and will control the heating and cooling sources 150, 152 accordingly. At this temperature, and for nickel based superalloys such as DSR 142 and Mar-M-247DS, with melting points ranging from about 2,400 to 2,600 degrees Fahrenheit, holding surface temperatures just below melting will relieve internal stresses created during manufacturing and assist in controlling the thermal gradient and establishing a meltback region into the build surface 170. It is further understood and contemplated that the temperature sensor 192 may be an infrared sensor or any other type of sensor capable of non-contact measurement.

With the build surface 170 at the pre-specified temperature, the next successive layer 168 of powder 176 may then be spread over the surface. When melted by the beam 190, the temperature sensor 192 is used to measure the thermal gradient across the melted pool and generally in the z-coordinate direction 182. Both the heating and cooling sources 150, 152 are utilized to maintain a desired thermal gradient. To promote directional grain growth, the heating sources 150 may be transiently operated and of an oscillating type to further control local temperature gradients at the surface of the additive build. Further, the thermal gradient is controlled in part through thermal conduction through the pre-solidified slices via the cooling source 152. The cooling source 152 may controllably flow coolant such as water through a series of channels 194 in the build table 142 for thermal conduction. During fabrication of the first few slices 164 of the hotspot portion 122, the coolant source 152 may not be needed or may run at minimal flow. As the hotspot portion 122 extends in the z-coordinate direction, through many slices, the cooling source 152 will ramp up as dictated by the controller 162 to induce further thermal conduction and maintain the desired thermal gradient.

The heating and cooling sources 150, 152 of the temperature control assembly 149 will operate similarly for controlling the solidification rate of the melted pools at a constant energy gun power, and to provide time for directional grain or single crystal growth as generally illustrated in FIG. 8. The controller 162 may apply an inverse solution method to determine optimal build parameters including adjustment of the laser gun 148 power. It is further understood and contemplated that the additive manufacturing system 140 may include a method where fusing of powder is done by high-speed accumulation and then laser sintered (laser spray deposition); or, a method that utilizes materials that are capable of equiax grain properties, materials capable of directional solidified (DS) grain structure, or materials capable of single crystal (SX) grain structure.

For the propagation of single crystal microstructure growth, either the single crystal seed 160 is applied to the process, or the powder 176 is of a single crystal microstructure, or both. Generally, and for rotational engine components such as blades in the turbine section 28 that experience mechanical loads, use of the seed 160 to additively manufacture a hot spot portion 122 of the blade (as oppose to just a single crystal powder) is desirable to resist creep rupture. In contrast, for static components that experience considerably less mechanical load, such as the liners 90, 96 of the combustor 56, use of the single crystal powder 176 and without the seed 160 may be sufficient.

Figure 10:
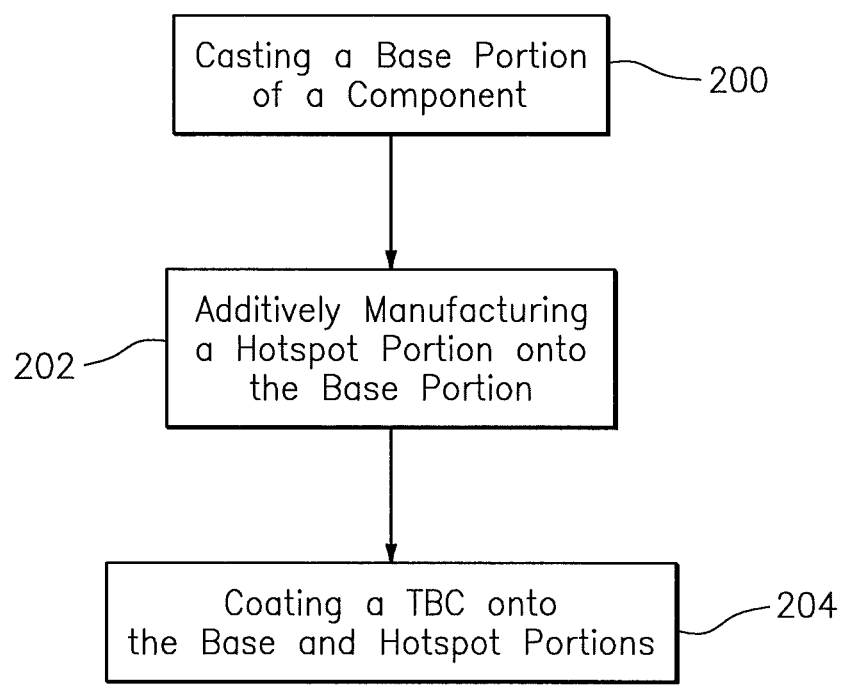
FIG. 10 is a flow chart of a method of forming the component.

Referring to FIG. 10, a method of forming a turbine engine component may include a first step 200 of casting a base portion 132 of the component that may or may not have a single crystal microstructure. A step 202 includes additively manufacturing a hotspot portion 122 having a single crystal microstructure onto the first portion by in-part controlling a temperature gradient and using a single crystal seed 160, a single crystal powder 176, or both. The next step 204 includes coating the base portion 132 and hotspot portion 122 with a TBC 112.

It is understood that relative positional terms such as "forward," "aft," "upper," "lower," "above," "below," and the like are with reference to the normal operational attitude and should not be considered otherwise limiting. It is also understood that like reference numerals identify corresponding or similar elements throughout the several drawings. It should be understood that although a particular component arrangement is disclosed in the illustrated embodiment, other arrangements will also benefit. Although particular step sequences may be shown, described, and claimed, it is understood that steps may be performed in any order, separated or combined unless otherwise indicated and will still benefit from the present disclosure.

The foregoing description is exemplary rather than defined by the limitations described. Various non-limiting embodiments are disclosed; however, one of ordinary skill in the art would recognize that various modifications and variations in light of the above teachings will fall within the scope of the appended claims. It is therefore understood that within the scope of the appended claims, the disclosure may be practiced other than as specifically described. For this reason, the appended claims should be studied to determine true scope and content.

What is claimed is:

1. A liner panel for a gas turbine engine combustion chamber comprising:
   a first portion comprising a first material;
   a second portion comprising a second material different than the first material, the second portion connected to the first portion at an interface, the first portion and the second portion collectively forming both a first surface and an opposing second surface extending between a first end and an opposing second end of the liner panel, wherein the interface is spaced from the first end and the second end, the first surface of the liner panel configured to face a combustion flow path of the gas turbine engine combustion chamber;
   a thermal barrier coating disposed on the first surface in contact with the first material and the second material; and
   a transverse portion comprising an outer surface extending radially outward from the second surface to an end surface and an inner surface extending radially outward from the first surface to the end surface, the inner surface defining a circumference of a dilution hole extending through the liner panel along a first length between an inner radial end and an outer radial end of the dilution hole, the second portion and the thermal barrier coating forming a part of the circumference of the dilution hole along the entire first length, wherein the first portion and the thermal barrier coating form a remainder of the circumference of the dilution hole along the entire first length;
   wherein the first material has a first heat resistance and the second material has a second heat resistance which is greater than the first heat resistance.

2. The liner panel of claim 1, wherein the second portion is a repair.

3. The liner panel of claim 2, wherein the first material does not have a single crystal microstructure and the second material has a single crystal microstructure.

4. The liner panel of claim 1, wherein the second material has a single crystal microstructure and the first material is a polycrystalline material.

5. The liner panel of claim 1, wherein the second portion is formed from a single crystal powder.

6. The liner panel of claim 4 further comprising: wherein the single crystal microstructure is formed from a seed located at the interface during formation of the second portion.

7. The liner panel of claim 6, wherein the second portion is a repair.

8. The liner panel of claim 4, wherein the first material is a casting.

9. The liner panel of claim 1, wherein the second portion defines a thickness of the transverse portion between the inner surface and the outer surface along the part of the circumference of the dilution hole.

10. The liner panel of claim 4, wherein the first material and the second material are made of a nickel-based alloy.

11. A liner panel for a gas turbine engine combustion chamber comprising:
   a first portion comprising a first material, wherein the first material is a polycrystalline material;
   a second portion comprising a second material having a single crystal microstructure, the second portion connected to the first portion at an interface, the first portion and the second portion collectively forming both a first surface and an opposing second surface extending between a first end and an opposing second end of the liner panel, wherein the interface is spaced from the first end and the second end, the first surface of the liner panel configured to face a combustion flow path of the gas turbine engine combustion chamber;
   a thermal barrier coating disposed on the first surface in contact with the first material and the second material; and
   a transverse portion comprising an outer surface extending radially outward from the second surface to an end surface and an inner surface extending radially outward from the first surface to the end surface, the inner surface defining a circumference of a dilution hole extending through the liner panel along a first length between an inner radial end and an outer radial end of the dilution hole, the second portion and the thermal barrier coating forming a part of a the circumference of the dilution hole along the entire first length, wherein the first portion and the thermal barrier coating form a remainder of the circumference of the dilution hole along the entire first length;
   wherein the first material has a first heat resistance and the second material has a second heat resistance which is greater than the first heat resistance.

12. A combustion chamber for a gas turbine engine comprising:
   a shell;
   a liner panel mounted to the shell, the liner panel comprising:
   a first portion comprising a first material;
   a second portion comprising a second material different than the first material, the second portion connected to the first portion at an interface, the first portion and the second portion collectively forming both a hot surface and an opposing cold surface extending between a first end and an opposing second end of the liner panel, wherein the interface is spaced from the first end and the second end, the cold surface and the shell defining a cavity therebetween; and
   a thermal barrier coating disposed on the hot surface; and
   a transverse portion comprising an outer surface extending radially outward from the cold surface to an end surface and an inner surface extending radially outward from the hot surface to the end surface, the inner surface defining a circumference of a dilution hole extending through the liner panel and the shell along a first length between an inner radial end and an outer radial end of the dilution hole, the second portion and the thermal barrier coating forming a part of the circumference of the dilution hole along the entire first length, wherein the first portion and the thermal barrier coating form a remainder of the circumference of the dilution hole along the entire first length;
   wherein the transverse portion extends through the shell with the end surface disposed on an exterior side of the shell opposite the liner panel and radially spaced from the shell;
   wherein the liner panel includes effusion holes that extend through the hot surface and the cold surface;
   wherein the effusion holes are in fluid communication with the cavity;
   wherein a first of the effusion holes is oriented in a first direction;
   wherein a second of the effusion holes is oriented in a second direction different than the first direction; and wherein the first material has a first heat resistance and the second material has a second heat resistance which is greater than the first heat resistance.

13. The combustion chamber of claim 12, wherein the shell includes a plurality of impingement holes configured to direct air into the cavity such that the air impinges upon the cold surface of the liner panel.

14. The combustion chamber of claim 12, wherein a third portion of the interface between the first portion and the second portion is parallel to the hot surface and the cold surface.

* * * * *